(12) United States Patent
DeVilbiss

(10) Patent No.: US 7,557,629 B2
(45) Date of Patent: Jul. 7, 2009

(54) PULSE STREAM GENERATOR

(76) Inventor: Alan J. DeVilbiss, 696 Columbia Ct., Colorado Springs, CO (US) 80904

( * ) Notice: Subject to any disclaimer, the term of this patent is extended or adjusted under 35 U.S.C. 154(b) by 0 days.

(21) Appl. No.: 11/740,754

(22) Filed: Apr. 26, 2007

(65) Prior Publication Data

US 2008/0265960 A1 Oct. 30, 2008

(51) Int. Cl.
*H03K 3/017* (2006.01)
(52) U.S. Cl. .................... 327/172; 327/291
(58) Field of Classification Search ............ None
See application file for complete search history.

(56) References Cited

U.S. PATENT DOCUMENTS 4,890,248 A * 12/1989 Reinhardt ............... 702/191
5,227,961 A * 7/1993 Claydon et al. ............ 363/17
5,789,958 A * 8/1998 Chapman et al. .......... 327/261

\* cited by examiner

*Primary Examiner*—Cassandra Cox
(74) *Attorney, Agent, or Firm*—Mark G. Pannell; Hanes & Schutz, LLC

(57) ABSTRACT

A system and method for generating a pulse stream are disclosed. A ramp signal is generated. The ramp signal is compared with a Time of Transition signal to produce a result indicative of the comparison. Responsive to the result of the comparison, the pulse stream signal is output. The result of the comparison instructs the selector whether to maintain the current output pulse stream signal or replace the current output pulse stream signal with a Polarity signal.

18 Claims, 5 Drawing Sheets

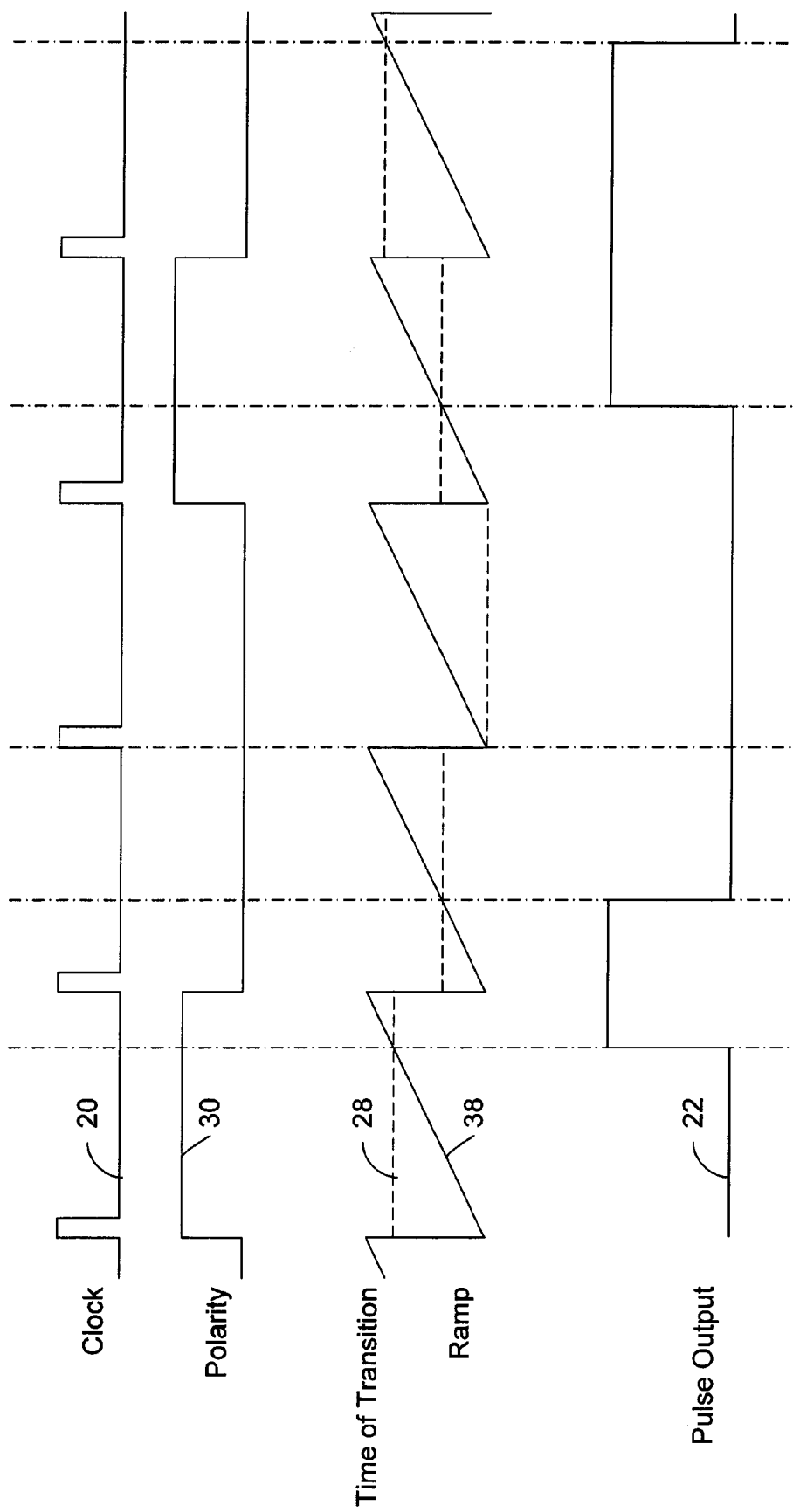

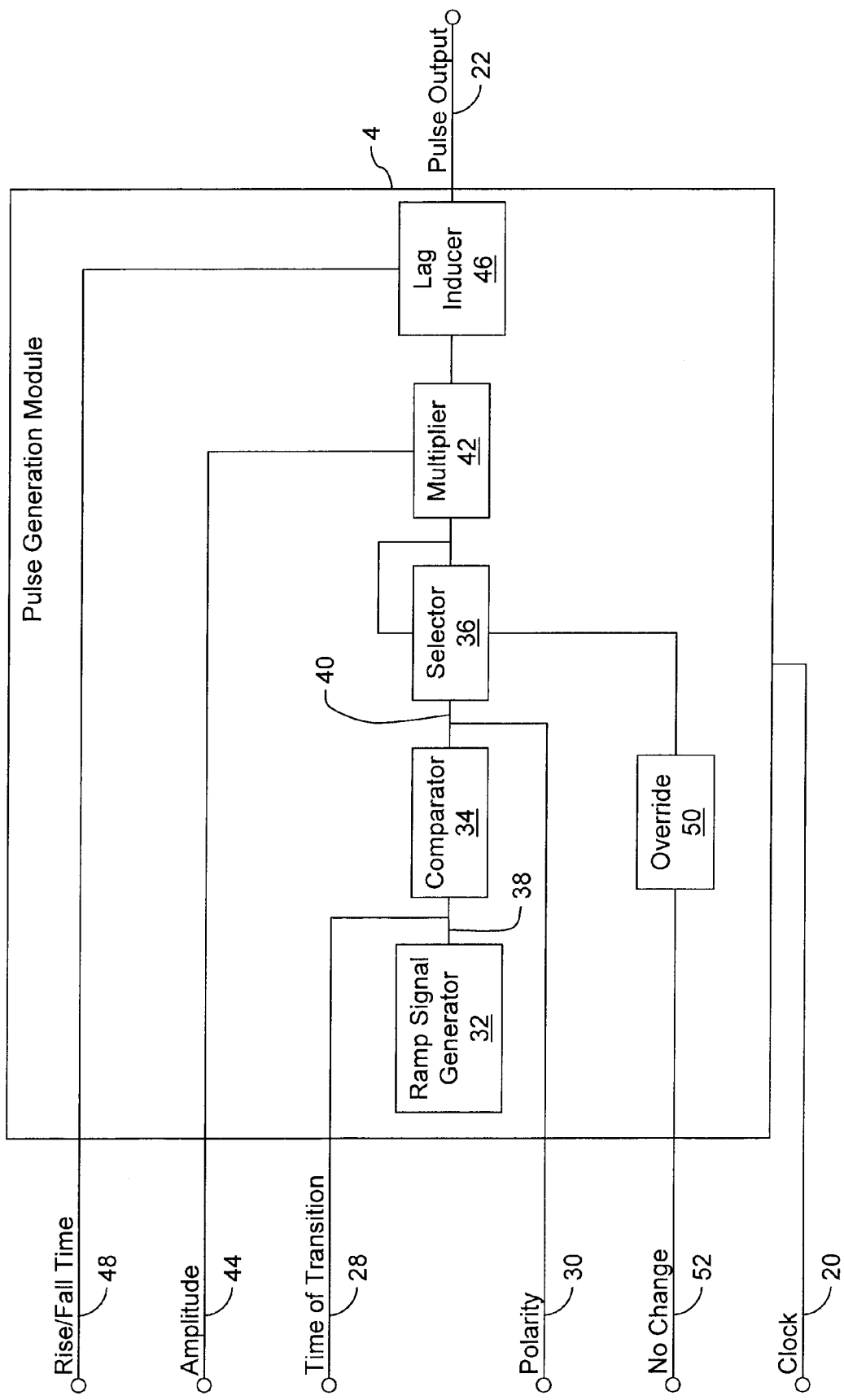

PULSE STREAM GENERATOR

BACKGROUND OF THE INVENTION

Pulse stream generators are devices for generating strings of pulses. The pulse streams have a number of useful applications, including device testing. In order to provide a variety of pulse alternatives, pulse generators often allow control of the pulse repetition rate or frequency, pulse width, the high- and low-voltage levels of the pulses, and the rise time and fall time of the pulses.

DESCRIPTION OF THE DRAWINGS

FIG. 4 is a timing diagram illustrating the operation of the present invention.

FIG. 5 is a block diagram of an alternate embodiment of the pulse generator module of FIG. 1.

DETAILED DESCRIPTION OF THE INVENTION

Figure 1:
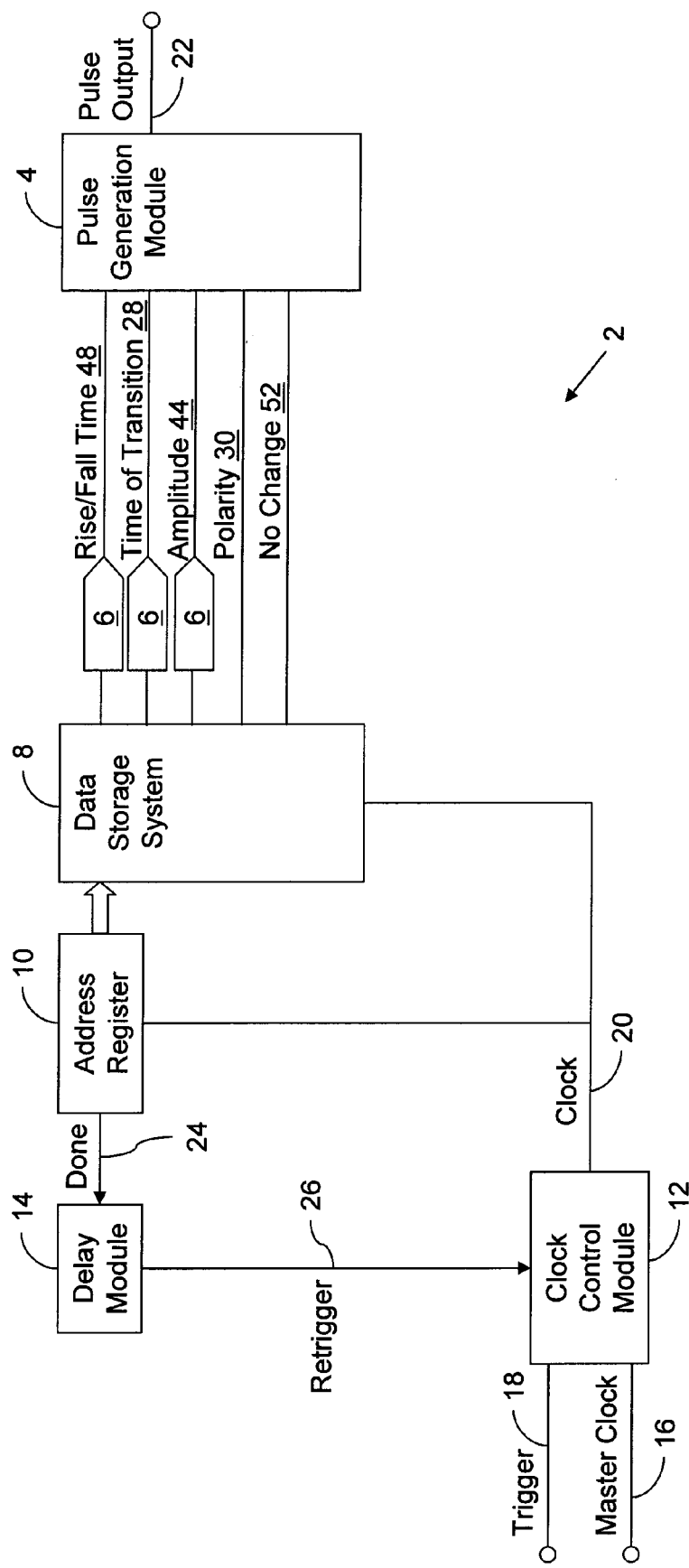
FIG. 1 is a block diagram of one embodiment of the pulse stream generator of the present invention.

FIG. 1 illustrates one embodiment of the pulse stream generator of the present invention. In this embodiment, pulse stream generator 2 includes pulse generation module 4, converter 6, data storage system 8, clock control 12, and delay module 14.

Data storage system 8 is any device or system configured to store multiple sets of data. These sets of values specify the pulse properties for each of many discrete time intervals within the pulse stream to be generated. In one embodiment, data storage system 8 stores a series of Time of Transition values and a series of Polarity values. In alternate embodiments, data storage system 8 also stores values for Rise and Fall Time, Amplitude, and No Change.

Data storage system 8 may be any type of storage media such as magnetic, optical, or electronic storage media. Data storage system 8 may also store the values in analog or digital format.

Data storage system 8 is illustrated in FIG. 1 as a single device. Alternatively, data storage system 8 may include more than one device. Furthermore, each device of data storage system 8 may be embodied in a different media type. For example, one device of data storage system 8 may be a magnetic storage media while another device of data storage system 8 is an electronic storage media.

Address register 10 is any device or system configured to sequentially designate and control access to stored data value sets. Address register 10 can be preset to an initial state, ready to access the first value set. When register controlled access is activated, as described below, each occurrence of a master clock 16 causes address register 10 to advance to a new state, accessing the value sets in the desired sequence. The master clock 16 has a period which defines the discrete time interval for which each set of values defining pulse properties is to be applied. The total number of possible states of address register 10 is adjustable and determines the duration of the pulse stream. The duration of the pulse stream is, in one embodiment, the number of possible states multiplied by the period of the clock 16.

Delay Module 14 is any device or system configured to introduce a delay. Clock control module 12 is any device or system for controlling application of master clock signal 16 to other functional elements. Clock control module 12 is activated by a triggering signal 18.

Upon receipt of triggering signal 18, clock signal 20 is applied to address register 10 and other functional elements and the pulse stream signal 22 is output. In one embodiment, upon completion of the pulse stream generation, address register 10 generates a signal of completion, Done signal 24, which inhibits the Clock signal 20.

Several operational modes are possible. In one embodiment, each occurrence of the triggering signal 18 causes one sequence of pulses to be output. Repetitive operation is achieved by using the Done signal 24 to retrigger 26 clock control module 12, either immediately or after a delay induced by delay module 14. Particularly in the repetitive operation case, it may be advantageous to choose (preset) the master clock 16 frequency to a frequency that is an integer multiple of the desired repetition frequency of the pulse train output 22. Such a selection of the master clock 16 frequency will facilitate the production of a pulse stream 22 of any desired repetition frequency.

Converter 6 is any device or system configured to convert values into a signal. In one embodiment, converter 6 is a digital to analog converter configured to convert digitally stored values to analog signals. Converter 6 may be a single device or an array of converters 6.

In one embodiment, converter 6 converts the designated Time of Transition values into a Time of Transition signal 28. Converter 6 may also convert other values, such as Polarity, Amplitude, No Change, and Rise and Fall Time values, into signals.

It is understood that different embodiments of the invention may be implemented with fewer or more parameters being specified at each stored value set. For example, one possible implementation could specify only the times of the pulse transitions relative to the clock 20 pulse, i.e. the Time of Transition signal 28, with the pulse amplitude and rise and fall time remaining at fixed, pre-programmed or preset, values or changing at the direction of a stored program at a different rate.

Additionally, it may be desirable in the implementation of the invention to, as part of the stored values data structure, specify one or more values to be passed directly to the pulse generation stage as one or more control signals. Examples shown in FIG. 1 are the two binary control signals Polarity 30 and No Change 52. The No Change signal 52 could be used to inhibit a change in the pulse output (a no operation), i.e., the output level 22 remains at the value determined in the previous clock 20 interval.

It may be advantageous to establish a protocol in the program data structure to allow specification of a No Operation Period to extend over an arbitrary programmed interval of an integer number of clock 20 cycles greater than unity. This will facilitate the production of pulse streams of longer duration than the quantity of data value sets stored in data storage system 8.

The Polarity control signal 30 is used to select the output level in an embodiment that uses preset amplitude values. It is understood that a number of different conventions could be successfully used in implementing the stored values data structure and the subsequent generation of analog and digital control signals to cause pulse generation module 4 to issue a desired series of pulses.

During the time interval during which data storage system 8 contents are being accessed, stored values are successively loaded at each clock 20 pulse into an array of digital to analog converters 6. Analog converters 6 produce analog signals from the values. In one embodiment, the analog signals are used in pulse generation module 4 to generate the time delay, rate of change, and amplitude change to implement the pulse specified by the digital stored values currently being accessed.

Figure 2:
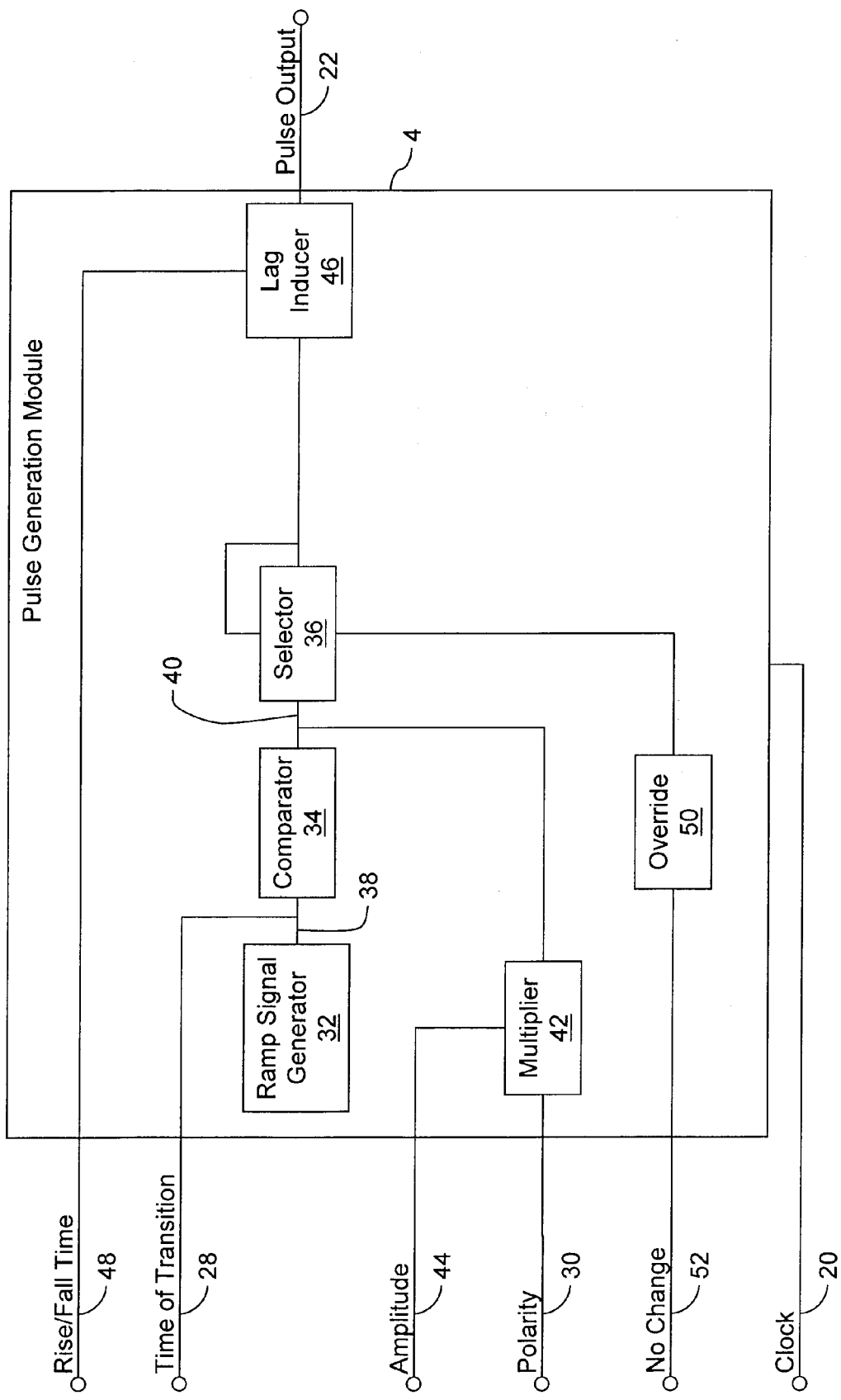
FIG. 2 is a block diagram of one embodiment of the pulse generator module of FIG. 1.

The Time of Transition signal 28 and the Polarity signal 30 are fed into pulse generation module 4. FIG. 2 illustrates one embodiment of pulse generation module 4. In this embodiment, pulse generation module 4 includes ramp signal generator 32, comparator 34, and selector 36.

Ramp signal generator 32 is any device or system configured to generate a ramp signal 38. Comparator 34 is any device or system configured to compare the ramp signal 38 with the Time of Transition signal 28 and produce a result 40 indicative of the comparison.

Selector 36 is any device or system configured to receive the Polarity signal 30 and output a pulse stream signal 22 responsive to the result 40 of the comparison. The result 40 of the comparison instructs selector 36 whether to maintain the current output pulse stream signal 22 or replace the current output pulse stream signal 22 with the Polarity signal 30.

In one embodiment, selector 36 is configured to replace the current output pulse stream signal 22 with the Polarity signal 30 when the result 40 of the comparison indicates the Time of Transition signal 28 equals the ramp signal 38.

In one embodiment, selector 36 is configured to replace the current output pulse stream signal 22 with the Polarity signal 30 when the result 40 of the comparison indicates the Time of Transition signal 28 is greater than the ramp signal 38.

In one embodiment, selector 36 is configured to replace the current output pulse stream signal 22 with the Polarity signal 30 when the result 40 of the comparison indicates the Time of Transition signal 28 is less than the ramp signal 38.

In one embodiment, pulse generation module 4 further includes multiplier 42 configured to modify the amplitude of the output pulse stream signal 22. In one embodiment (FIG. 2), multiplier 42 is configured to modify the amplitude of the output pulse stream signal 22 by multiplying the Polarity signal 30 by an Amplitude signal 44. In an alternative embodiment (FIG. 5), multiplier 42 is configured to modify the amplitude of the output pulse stream signal 22 by multiplying the output pulse stream signal 22 by the Amplitude signal 44.

In one embodiment, pulse generation module 4 further includes lag inducer 46 configured to receive a Rise and Fall Time signal 48 and modify the rise and fall times of the output pulse stream signal 22.

In one embodiment, pulse generation module 4 further includes override 50 configured to receive No Change signal 52 and instruct selector 36 to ignore the result 40 of the comparison and maintain the current output pulse stream signal 22.

Figure 3:
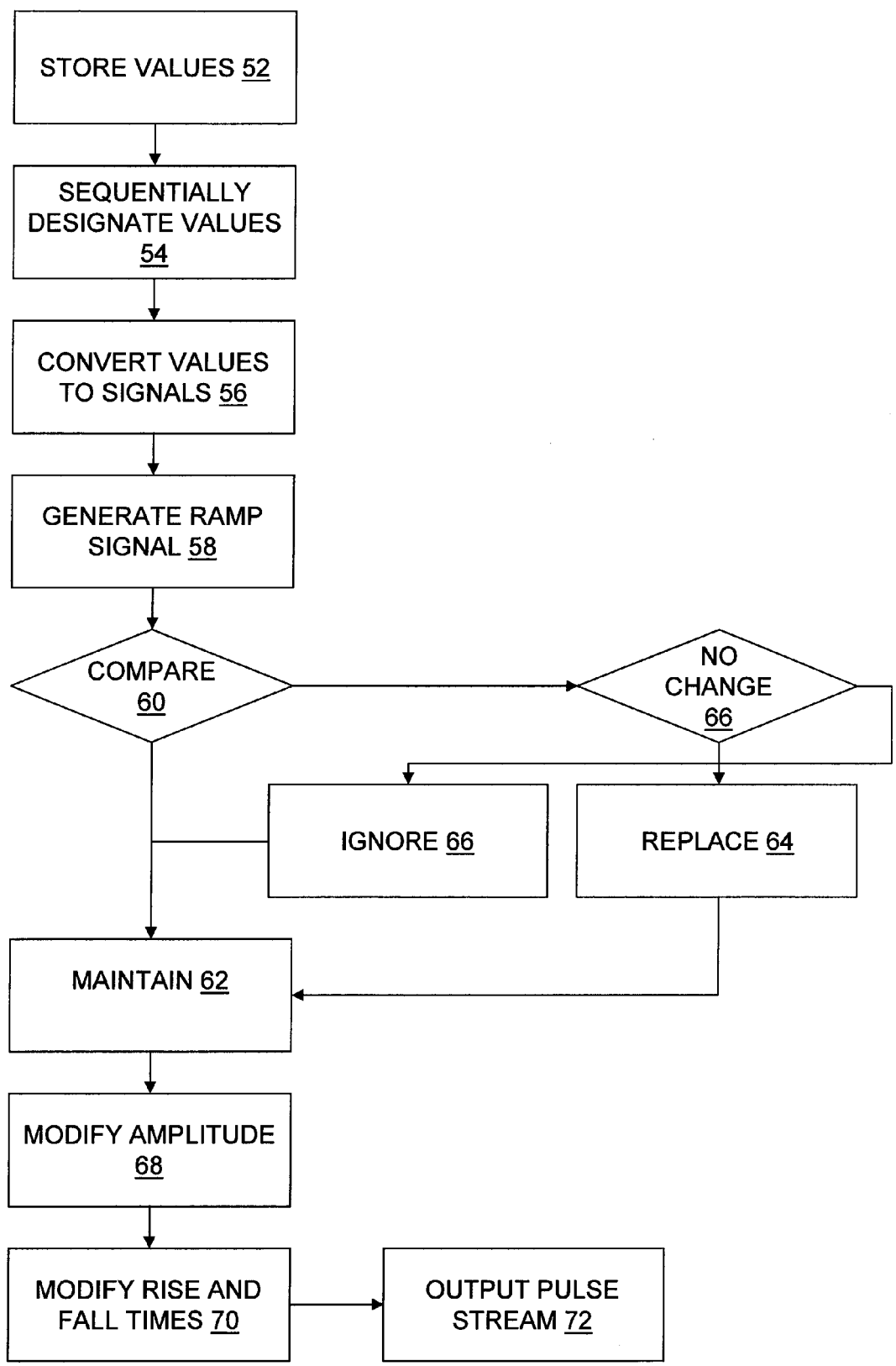
FIG. 3 is a flow chart illustrating one embodiment of the method of the present invention for generating a pulse stream.

FIG. 3 is a flow chart representing steps of one embodiment of the present invention. Although the steps represented in FIG. 3 are presented in a specific order, the present invention encompasses variations in the order of steps. Furthermore, additional steps may be executed between the steps illustrated in FIG. 3 without departing from the scope of the present invention.

A series of Time of Transition values and a series of Polarity values are stored 52. Stored Time of Transition values and Polarity values are sequentially designated 54. The designated Time of Transition values and Polarity values are converted 56 to a Time of Transition signal 28 and a Polarity signal 30, respectively. A ramp signal 38 is generated 58. The ramp signal 38 is compared 60 to the Time of Transition signal 28 to produce a result 40 indicative of the comparison.

The result 40 of the comparison determines whether to maintain 62 the current output pulse stream signal 22 or replace 64 the current output pulse stream signal 22 with the Polarity signal 30. Depending on the desired configuration, the current output pulse stream signal 22 is replaced 64 with the Polarity signal 30 when the result 40 of the comparison indicates the Time of Transition signal 28 equals the ramp signal 38, is greater than the ramp signal 38, or is less than the ramp signal 38. Responsive to the result 40 of the comparison, the pulse stream signal 22 is output 72.

In one embodiment, the No Change signal 52 is considered. Responsive to the No Change signal 52, the result 40 of the comparison is ignored 66 and the current output pulse stream signal 22 is maintained 62.

In one embodiment, the amplitude of the output pulse stream signal 22 is modified 68 according to the Amplitude signal 44. The amplitude of the output pulse stream signal 22 is modified 68 by either multiplying the Polarity signal 30 by the Amplitude signal 44 or by multiplying the output pulse stream signal 22 by the Amplitude signal 44.

In one embodiment, the Rise and Fall Time signal 48 is considered. The rise and fall times of the output pulse stream signal 22 are modified 70 according to the Rise and Fall Time signal 48.

FIG. 4 illustrates the means by which stored values specifying times of transition are converted into a pulse stream 22 with the desired timing. In this example, signals, Polarity 30 and Time of Transition 28, developed from stored values in data storage system 8 change to the next value on each positive edge of the Clock signal 20, and remain constant through the interval until the next positive Clock 20 edge. The ramp signal 38 is generated within pulse generation module 4, synchronized to the positive clock 20 edge, with amplitude corresponding to the output range of the digital to analog converter 6 that outputs the Time of Transition signal 28. Within pulse generation module 4 comparator 34 determines the time at which the ramp signal exceeds the current Time of Transition signal 28, and at that instant switches the Pulse Output 22 to the high level if Polarity 30 is true, or to the low level if Polarity 30 is false. This example assumes the two pulse output levels are preset.

One advantage of the present invention is that it allows the generation of a stream of electrical pulses having arbitrary properties, such as timing and Polarity of the pulse transitions, the amplitudes of the pulses, the rise and fall times of the pulse transitions, and the repetition frequency of the pulse stream.

The foregoing description is only illustrative of the invention. Various alternatives, modifications, and variances can be devised by those skilled in the art without departing from the invention. Accordingly, the present invention embraces all such alternatives, modifications, and variances that fall within the scope of the described invention.

What is claimed is:

1. A pulse stream generator comprising:
   a ramp signal generator configured to generate a ramp signal;
   a comparator configured to compare the ramp signal with a Time of Transition signal and produce a result indicative of the comparison; and
   a selector configured to receive a Polarity signal and output a pulse stream signal responsive to the result of the comparison, wherein the result of the comparison instructs the selector whether to maintain the current output pulse stream signal or replace the current output pulse stream signal with the Polarity signal.

2. The pulse stream generator of claim 1 wherein the selector is configured to replace the current output pulse stream signal with the Polarity signal when the result of the comparison indicates the Time of Transition signal equals the ramp signal.

3. The pulse stream generator of claim 1 wherein the selector is configured to replace the current output pulse stream signal with the Polarity signal when the result of the comparison indicates the Time of Transition signal is greater than the ramp signal.

4. The pulse stream generator of claim 1 wherein the selector is configured to replace the current output pulse stream signal with the Polarity signal when the result of the comparison indicates the Time of Transition signal is less than the ramp signal.

5. The pulse stream generator of claim 1 further including a multiplier configured to modify the amplitude of the output pulse stream signal by multiplying the Polarity signal by an Amplitude signal.

6. The pulse stream generator of claim 1 further including a multiplier configured to modify the amplitude of the output pulse stream signal by multiplying the output pulse stream signal by an Amplitude signal.

7. The pulse stream generator of claim 1 further including a lag inducer configured to receive a Rise and Fall Time signal and modify the rise and fall times of the output pulse stream signal by inducing lag in the output pulse stream according to the Rise and Fall Time signal.

8. The pulse stream generator of claim 1 further including an override configured to receive a No Change signal and instruct the selector to ignore the result of the comparison and maintain the current output pulse stream signal.

9. The pulse stream generator of claim 1 further including:
a data storage system configured to store of a series of Time of Transition values and a series of Polarity values;
an address register configured to sequentially designate a stored Time of Transition value and a stored Polarity value; and
a converter configured to convert the designated Time of Transition values into the Time of Transition signal.

10. A method for generating a pulse stream, the method comprising:
generating a ramp signal;
comparing the ramp signal with a Time of Transition signal to produce a result indicative of the comparison; and
outputting a pulse stream signal responsive to the result of the comparison, wherein the result of the comparison determines whether to maintain the current output pulse stream signal or replace the current output pulse stream signal with a Polarity signal.

11. The method of claim 10 wherein the current output pulse stream signal is replaced with the Polarity signal when the result of the comparison indicates the Time of Transition signal equals the ramp signal.

12. The method of claim 10 wherein the current output pulse stream signal is replaced with the Polarity signal when the result of the comparison indicates the Time of Transition signal is greater than the ramp signal.

13. The method of claim 10 wherein the current output pulse stream signal is replaced with the Polarity signal when the result of the comparison indicates the Time of Transition signal is less than the ramp signal.

14. The method of claim 10 further including modifying the amplitude of the output pulse stream signal by multiplying the Polarity signal by an Amplitude signal.

15. The method of claim 10 further including modifying the amplitude of the output pulse stream signal by multiplying the output pulse stream signal by an Amplitude signal.

16. The method of claim 10 further including modifying the rise and fall times of the output pulse stream signal by inducing lag in the output pulse stream signal according to a Rise and Fall Time signal.

17. The method of claim 10 further including responsive to a No Change signal, ignoring the result of the comparison and maintain the current output pulse stream signal.

18. The method of claim 10 further including:
storing a series of Time of Transition values and Polarity values;
sequentially designating a stored Time of Transition value; and
converting the designated Time of Transition values and Polarity values into the Time of Transition signal and the Polarity signal, respectively.

* * * * *